United States Patent [19]

Telfer

[11] 3,852,690

[45] Dec. 3, 1974

[54] MICROWAVE TRANSMISSION LINE TO GROUND PLANE TRANSITION

[75] Inventor: Thomas Andrew Telfer, Clinton, N.Y.

[73] Assignee: General Electric Company, Utica, N.Y.

[22] Filed: Jan. 2, 1973

[21] Appl. No.: 320,346

[52] U.S. Cl. .................. 333/84 M, 29/625, 29/628, 174/68.5, 174/75 C, 333/33, 339/17 B, 339/17 N

[51] Int. Cl. .............................................. H01p 3/08

[58] Field of Search .......... 29/625, 628, 470, 470.7, 29/471.1, 471.3, 471.9, 472.1, 472.9, 624; 174/68.5, 78, 50.52, 59.56, 51, 59, 60, 64, 65, 52 R, 52 S; 317/101 B, 101 CC, 101 CE, 101 DH; 339/13, 14 R, 14 L, 17 B, 17 R, 17 L, 17 LC, 17 N, 275 R, 275 B

[56] References Cited

UNITED STATES PATENTS

| | | | |
|---|---|---|---|
| 3,013,227 | 12/1961 | Jordan | 333/84 M X |
| 3,142,721 | 7/1964 | Long | 174/65 R |
| 3,195,026 | 7/1965 | Wegner et al. | 174/52 S |
| 3,247,578 | 4/1966 | Jaremus et al. | 29/625 UX |
| 3,383,457 | 5/1968 | Schumacher et al. | 174/68.5 |
| 3,436,606 | 4/1969 | Reed et al. | 174/50.52 X |
| 3,443,160 | 5/1969 | Salera | 174/68.5 X |
| 3,453,377 | 7/1969 | Gillespie | 174/75 C |
| 3,519,890 | 7/1970 | Ashby | 174/68.5 X |
| 3,530,231 | 9/1970 | Penoyer | 339/275 R X |
| 3,553,607 | 1/1971 | Lehrfeld | 333/84 M X |
| 3,617,877 | 11/1971 | Hobson | 333/84 M X |
| 3,621,478 | 11/1971 | Johnson et al. | 333/84 M X |
| 3,739,302 | 6/1973 | McManus | 333/84 M X |
| 3,743,748 | 7/1973 | Reeder | 174/75 C |

*Primary Examiner*—C. W. Lanham
*Assistant Examiner*—Joseph A. Walkowski

[57] ABSTRACT

In order to provide a transition from a ground plane of a component such as a stripline or microstrip conductor on a substrate, for connection to a conductor such as the wall of a microcircuit package at ground potential, a thin, flexible metallic strap of low resistance material is bonded to the metallization forming the ground plane and connected to the conductor. A reliable, inspectable bond to the ground plane is provided, and the ground plane may be bonded in a package with a resilient material. Reliable, inspectable bonding of the strap to the ground plane is thus provided even in packages made of materials which do not match the thermal expansion rates of substrate materials.

4 Claims, 5 Drawing Figures

MICROWAVE TRANSMISSION LINE TO GROUND PLANE TRANSITION

BACKGROUND OF THE INVENTION

This invention relates to electrical conductors and more particularly to a transition from a ground plane conductor on a substrate to another conductor in a package.

This invention finds application in the area of microwave integrated circuits. A microwave circuit such as an amplifier, oscillator, or filter is included in a package and must be connected to a transmission line interfacing with the package or to another conductor. The microwave circuit may be a well-known strip line or microstrip conductor, both of which include a ground plane conductor on the lower surface of the substrate having circuitry on an upper surface. In a nominal application, the substrate may be a two inch square of alumina metallized on the upper and lower surfaces and included in a well-known hermetic package. A coaxial conductor may extend through the side of the package. It is necessary to provide a transition from the ground plane of the microwave circuit to the ground conductor of the coaxial conductor and to retain the microwave circuit in the package. The invention is similarly useful in the construction of high speed digital circuitry.

One common technique is to metallize the lower surface of the substrate and attempt to make a low electrical resistance between the back of the substrate and the supporting surface of the package on which the substrate rests. Present methods of achieving this technique include solder bonding, bonding with conductor epoxy and contact pressure. Various limitations arise in each method. For example, solder bonding requires a match of thermal expansion rates between the package and the substrate, lest a tendency arise for the substrate to crack as temperature changes. The soldering operation is hidden, with no effective means of insuring wetting, i.e., distribution of solder, in the critical areas. A critical area is a portion of the substrate in which frequencies of operation are such that a ground potential is required under the substrate in order to avoid adverse effects. If flux is used to promote wetting, there is flux entrapment between the substrate and supporting surface, which may yield spots of flux rather than conductive solder in critical areas. Conductive epoxy sometimes gives relatively high resistance bonds and provides a bond which can degrade during temperature cycling. This bonding operation is also hidden. In other words, after the bond is made, it cannot be inspected. Where a contact pressure is used to maintain the lower surface of the substrate at ground potential, forcing the substrate metallization against the supporting surface does not provide a stable low resistance contact. Even where both surfaces are gold plated to maximize conductivity, eventually the pressure contact will have a higher resistance than a bond. Further, any imperfections in flatness of the metallization and supporting surface will make it impossible to insure a low resistance bond in critical areas.

SUMMARY OF THE INVENTION

It is, therefore, an object of the present invention to provide a transition from the ground plane of a substrate to another conductor.

It is a specific object in one form of the present invention to provide a reliable transition from the metallization on the lower surface of a substrate bonded onto a supporting surface in a package to a conductor communicating with the package.

It is also an object of the present invention to provide a transition of the type described in which a low resistance ground connection in critical areas is insured.

It is also a specific object of the present invention to provide a low resistance of the type described which may be inspected.

Briefly stated, in accordance with the present invention, a ground plane of a component, e.g., metallization on the lower surface of a substrate, is bonded to a thin, flexible conductive strap of low resistance material. The strap is also connected to a conductor, providing a transition. The bond between the ground plane and strap may be inspected prior to bonding the strap and substrate to a supporting surface in the package.

BRIEF DESCRIPTION OF THE DRAWINGS

The means by which the foregoing objects and features of novelty are provided are pointed out with particularity in the claims forming the concluding portion of the specification. The invention, both as to its organization and manner of operation, may be further understood by reference to the following description taken in connection with the following drawings.

Of the drawings.

DESCRIPTION OF THE PREFERRED EMBODIMENTS

Figure 1:
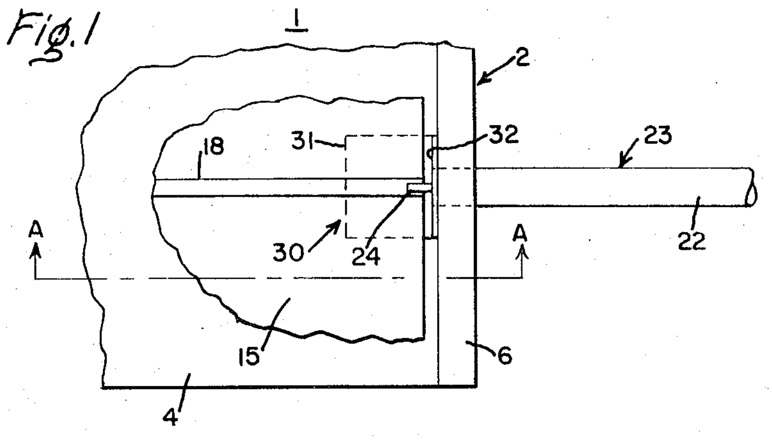
FIG. 1 is a plan view of a microcircuit assembly incorporating the present invention.
Figure 2:
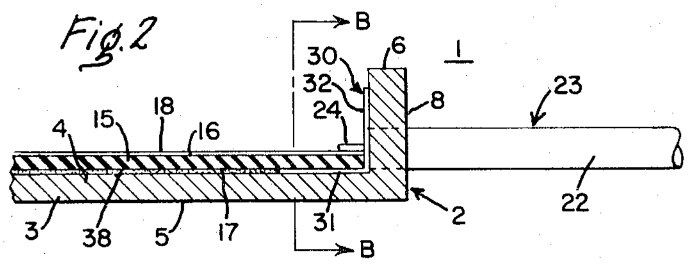
FIG. 2 is an elevation of a construction in accordance with the present invention taken along section lines A—A of FIG. 1.
Figure 3:
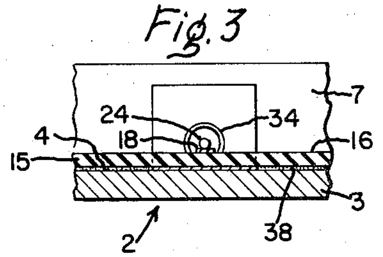
FIG. 3 is a cross-sectional view of FIG. 2 taken along section lines B—B of FIG. 2.

Referring now to FIGS. 1, 2 and 3, there is illustrated a microcircuit assembly 1 incorporating a transmission line to ground plane transition constructed in accordance with the present invention. The assembly 1 includes a conductive package 2, constructed of a material such as low carbon steel or "Kovar." The package 2 includes a base 3 having an upper surface 4 for supporting circuitry and a lower surface 5, as well as a wall 6 having an inner surface 7 and outer surface 8. Circuitry is included on a substrate 15 having an upper surface 16 and a lower surface 17. The upper surface 16 in a typical embodiment includes circuit elements and is maintained at a positive potential. A conductor 18 is formed on the upper surface 16. The lower surface 17 is metallized and may be referred to as the ground plane for maintenance at ground potential. The lower surface 17 faces and is mounted on the upper surface 4 of the package 2.

In the present embodiment, the transition is made from the ground plane 17 of the substrate 15 to an outer conductor 22 of a coaxial conductor 23 having a center conductor 24. The center conductor 24 is connected to circuitry supported on the upper surface 16, and the outer conductor 22 is provided for connection to the ground plane 17. The outer conductor 22 extends through and is conductively connected to the wall 6 of the package 2 and is maintained at ground potential. In order to assure that the ground plane 17 is maintained at ground potential, a transition must be provided. In accordance with the present invention, in a manner described below, the transition is provided by means of a conductive strap 30 having a first portion 31 for securing to the ground plane 17 and a second portion 32 for securing to the inner surface 7 of the wall 6.

In a low frequency application, use of a conventional transition is adequate. However, at high frequencies, for example, from 100 MHz up to the gigahertz range and beyond, a reliable low resistance connection to the ground plane 17 is critical. Where there is an impedance discontinuity, operation is adversely affected. Where the circuit grounded is an amplifier, loss of gain and bandwidth may result along with inducing of oscillations. In the case of grounding of one conductor of a transmission line, an impedance mismatch at the ground plane 17 causes an increase in voltage standing wave ratio (VSWR).

It should also be noted that the present invention is utilized in a microcircuit environment. The conductor 18 or the metallization on the ground plane 17 may be only 300 microinches thick in a typical embodiment. The substrate 15 might be only 25 mils thick, and the outer conductor 24 may be a tube 0.089 inches in diameter. Use of conventional methods in such an environment could easily adversely affect electrical and mechanical characteristics of a transition. Therefore, the present invention is used in critical areas. An example of a critical area is the portion of the ground plane 17 in registration with the portion of the conductor 18 to which the center conductor 24 of the coaxial cable 23 is connected.

In accordance with the present invention, a thin piece of electrically conductive material, the strap 30 in the present embodiment, is provided and the first portion 31 of the strap 30 is bonded to the metallization on the lower surface 17. For most effective grounding, it is necessary for the ground plane 17 to be as near the upper surface 4 of the package 2 as possible. Therefore, in accordance with the present invention, the strap 30 consists of gold plated brass 2 mils thick. Other conductive materials such as copper, brass or silver may be used. The most desirable materials for the strap 30 are highly conductive, flexible and easily wetted by bonding alloys. Length and width of the strap 30 are not critical. The portion 31 should be of sufficient size to be in registration with a critical area. The portion 32 must be made in a manner apparent to one skilled in the art to be capable of reliable connection to a conductor or surface at ground potential. A number of different solders can be used for a reliable bond between the portion 31 and the metallization 17. One suitable solder is well-known gold-germanium solder having a melting point of 356°C.

Since the strap portion 31 is bonded to the metallization on the surface 17 prior to placing the substrate 15 in the package 2, the bond may be inspected. For the application of FIG. 1, in which a transition is provided to coaxial cable, a hole 34 (FIG. 3) is formed in the portion 32 and the portions 31 and 32 are bent at right angles with respect to each other (FIG. 2). The substrate 15 is next placed on the upper surface 4 of the package 2 with a bonding agent 38 being provided between the lower surface 17 and upper surface 4. The portion 32 is positioned with the hole 34 in registration with the coaxial conductor 23. Adjustments are made to the position of the substrate 15 to obtain registration of the portion 31 with the exposed end of the conductor 24. The lower surface 17 is then bonded to the upper surface 4 of the package 2 with either an electrically conductive or nonconductive material. An example of an inert, reliable, high strength bonding material is Teflon. The portion 32 of the strap 30 is then bonded to the inner surface 7 of the wall 6 by any convenient means such as welding or soldering.

Figure 4:
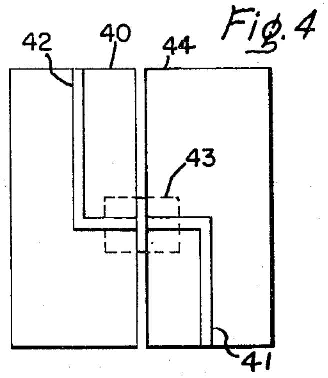
FIGS. 4 and 5 are illustrative of further applications of the present invention.

The invention also finds application in joining the junction of two micro strip ground conductors 41 and 42, as illustrated in FIG. 4, on substrates 44 and 40 by means of a strap 43.

Figure 5:
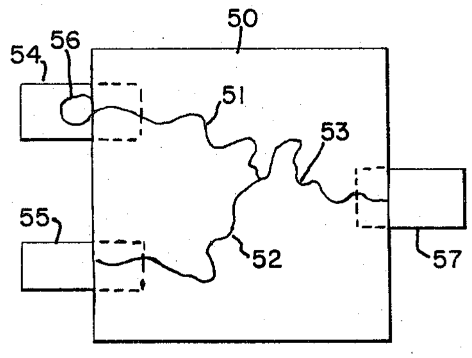

FIG. 5, another substrate 50 is illustrated to which straps 54, 55 and 57 are connected to the ground plane under conductors 51, 52 and 53 formed by metallization on the substrate 50. The strap 54 has a hole 56 formed therein for registration with a coaxial conductor, and the strap 55 is illustrated prior to the forming of a hole for registration with a coaxial conductor, and the strap 57 is illustrated for connection to, for example, a metallized conductor on another substrate (not shown).

What is thus provided is a low resistance grounding method in which conductive material, preferably comprising a flexible strap, is bonded to metallization on the lower surface of a microwave circuit substrate in critical areas. A reliable, low resistance, inspectable connection is provided for transition to another conductor. Even at high frequencies, a reliable transition is provided which is not subject to degradation due to temperature cycling or vibration.

What is claimed as new and desired to be secured by Letters Patent of the United States is:

1. A method for providing a low resistance transition from a coaxial cable to a substrate having metallized circuit areas on both surfaces, one of the latter being a ground plane microwave circuit, comprising the steps of:

providing a strap of thin conductive material with an aperture near one end thereof;

conductively joining an end of said strap to said substrate ground plane circuit;

positioning said substrate on a conductive support member having a coaxial cable affixed thereto with the outer conductor electrically joined therewith, the aperture in said strap being aligned such that the center conductor of said cable extends therethrough;

bonding said substrate and said strap to said support member;

and conductively joining said center conductor to a circuit area on said substrate located on the opposite side of said substrate from, and in registration with, the portion of said ground plane circuit which is bonded to said strap.

2. In an r-f circuit for frequencies above 100 MHz means for connecting a coaxial cable to a substrate having metallized circuit areas on both surfaces, one of the latter being a ground plane circuit, comprising:

electrically conductive support means for supporting said coaxial cable adjacent said substrate, the center conductor of said cable being electrically joined to a circuit area on said substrate opposite said ground plane circuit and the outer conductor of said cable being electrically joined to said support means;

a thin conductive strap conductively joined to said ground plane circuit at a location which is in registration with said center conductor connection point and having an aperture through which said center conductor extends; and means for conductively joining said strap to said support means at an area of the former adjacent said aperture.

3. The combination set forth in claim 1 wherein said support means is oriented such that the axis of said cable is supported in a direction parallel to said substrate.

4. The combination set forth in claim 1 wherein said support means is oriented such that the axis of said cable is supported in a direction perpendicular to said substrate.

* * * * *